(12) United States Patent
Fu (10) Patent No.: US 7,695,567 B2
(45) Date of Patent: Apr. 13, 2010

(54) WATER VAPOR PASSIVATION OF A WALL FACING A PLASMA

(75) Inventor: Xinyu Fu, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 607 days.

(21) Appl. No.: 11/351,676

(22) Filed: Feb. 10, 2006

(65) Prior Publication Data

US 2007/0190266 A1 Aug. 16, 2007

(51) Int. Cl.
*B08B 7/00* (2006.01)
(52) U.S. Cl. .................... 134/1.2; 134/26; 427/534
(58) Field of Classification Search ............. 438/905; 134/1.3
See application file for complete search history.

(56) References Cited

U.S. PATENT DOCUMENTS

| | | | | |
|---|---|---|---|---|
| 5,581,156 | A * | 12/1996 | Roberts et al. | 315/111.81 |
| 6,440,864 | B1 | 8/2002 | Kropewnicki et al. | 438/710 |
| 6,635,569 | B1 * | 10/2003 | Ameen et al. | 438/680 |
| 7,244,683 | B2 | 7/2007 | Chung et al. | 438/758 |
| 2001/0019901 | A1 * | 9/2001 | Sano et al. | 438/769 |
| 2002/0052114 | A1 * | 5/2002 | Marks | 438/689 |
| 2002/0164877 | A1 * | 11/2002 | Catabay et al. | 438/694 |
| 2002/0182385 | A1 * | 12/2002 | Senkevich et al. | 428/209 |
| 2003/0029837 | A1 * | 2/2003 | Trow | 216/67 |
| 2003/0183244 | A1 * | 10/2003 | Rossman | 134/1.1 |
| 2003/0183245 | A1 * | 10/2003 | Sheu | 134/1.2 |
| 2003/0194495 | A1 | 10/2003 | Li et al. | 427/255.28 |
| 2004/0000321 | A1 * | 1/2004 | Cui et al. | 134/1.2 |
| 2004/0018715 | A1 * | 1/2004 | Sun et al. | 438/622 |
| 2004/0144489 | A1 * | 7/2004 | Satoh et al. | 156/345.35 |
| 2004/0166612 | A1 * | 8/2004 | Maydan et al. | 438/149 |
| 2004/0197946 | A1 * | 10/2004 | Vaartstra et al. | 438/99 |
| 2004/0200499 | A1 * | 10/2004 | Harvey et al. | 134/1.1 |
| 2004/0219789 | A1 * | 11/2004 | Wood et al. | 438/690 |
| 2004/0256351 | A1 * | 12/2004 | Chung et al. | 216/13 |
| 2005/0048219 | A1 * | 3/2005 | Sheu | 427/535 |
| 2005/0098111 | A1 * | 5/2005 | Shimizu et al. | 118/715 |
| 2006/0211246 | A1 * | 9/2006 | Ishizaka et al. | 438/685 |
| 2006/0260750 | A1 * | 11/2006 | Rueger | 156/345.38 |

OTHER PUBLICATIONS

Knovel Critical Tables-2003 copyright-Electronic ISBN 978-1-59124-550-6.*

(Continued)

*Primary Examiner*—Michael Cleveland
*Assistant Examiner*—Nicole Blan
(74) *Attorney, Agent, or Firm*—Law Offices of Charles Guenzer (57) ABSTRACT

A chamber passivation method particularly useful for hydrogen plasma cleaning of low-k dielectrics prior to coating a barrier layer into a via hole with hydrogen radicals are provided from a remote plasma source. For each wafer, the chamber is passivated with water vapor (or other gas even more chemabsorbed on plasma facing walls) passed through the remote plasma source prior to the ignition of the hydrogen plasma. The water vapor is absorbed on walls, such as alumina and quartz parts of the remote plasma source, and forms a protective mono-layer that endures sufficiently long to protect the walls during the generation of the hydrogen plasma. Thereby, the plasma facing walls, particularly of a dielectric such as alumina, are protected from etching.

15 Claims, 4 Drawing Sheets

OTHER PUBLICATIONS

Chen et al., "Advances in remote plasma sources for cleaning 300 mm and flat panel CVD systems", *Semiconductor Magazine*, Aug. 2003, pp. 6.

Redhead, "Modeling the pump-down of a reversibly adsorbed phase. I. monolayer and submonolayer initial coverage", *Journal of Vacuum Science and Technology A*, vol. 13 (2), Mar./Apr. 1995, pp. 467-475.

Haas et al., "The chemistry of water on alumina surfaces; reaction dynamics from first principles", *Science*, vol. 282, Oct. 9, 1988, pp. 265-268.

* cited by examiner (Prior Art)
FIG. 1

WATER VAPOR PASSIVATION OF A WALL FACING A PLASMA

FIELD OF THE INVENTION

The invention relates generally to plasma cleaning in the process of fabricating integrated circuits. In particular, the invention relates to plasma cleaning performed between patterned etching of a dielectric layer and deposition.

BACKGROUND ART

Advanced integrated circuits, such as those contemplated for the 45 nm node, will require the use of extra low-k dielectric (electrically insulating) materials for the interlevel dielectric layer interconnecting two levels of wiring. Low-k materials having a dielectric constant of somewhat less than 3.9 (the value for silicon dioxide) have already entered commercial production. However, even lower dielectric constants, for example, below 2.5, will be required in the future. An example of this material is Black Diamond™ II (BDII) dielectric commercially available from Applied Materials of Santa Clara, Calif. This dielectric material, which Li describes in United States Patent Application 2003/0194495, may be characterized as carbon-doped silicon oxide (also called silicon oxycarbide) having a carbon fraction of above 10 at %. Improvements include BDIIx dielectric, which is UV cured and may have a porosity of 30%, and DBIIebeam dielectric, which is cured with electrons. Other carbon-containing low-k dielectrics are known, including Silk® and Cyclotene® (benzocyclobutene) dielectric materials available from Dow Chemical. Many of these materials are characterized as organic or polymeric dielectrics.

Figure 1:
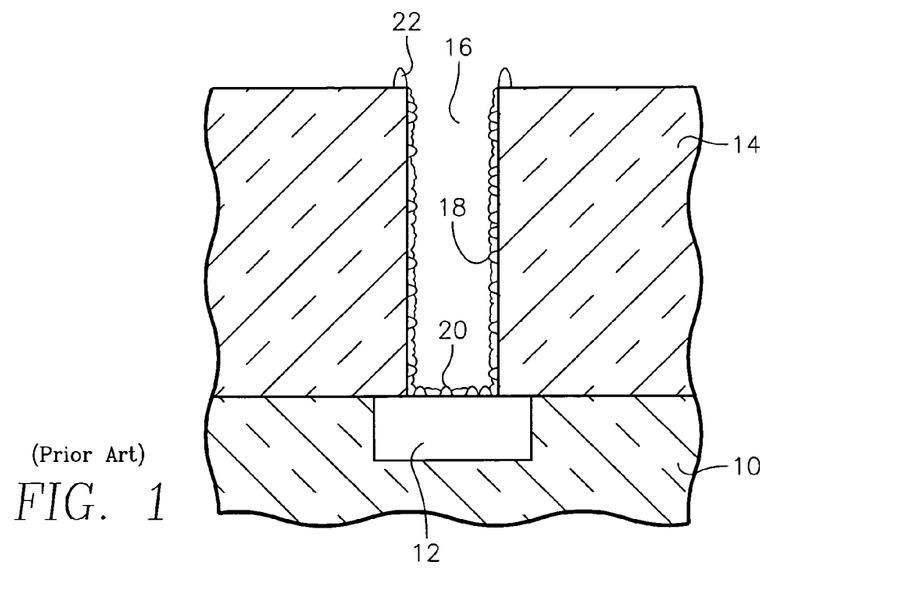
FIG. 1 is a cross-sectional view of an inter-level interconnect structure or via.

A prototypical structure in the formation of an inter-level interconnect is illustrated in the cross-sectional view of FIG. 1. A lower dielectric layer 10 includes a conductive feature 12 formed at its surface. The conductive feature 12 for advanced inter-level connections is typically composed of copper but similar geometries apply to contacting active semiconductor regions of a silicon substrate. An upper dielectric layer 14 of ultra low-k dielectric material is deposited over the lower dielectric layer 10 and the conductive feature. A hole 16 is photolithographically defined and etched through the upper dielectric layer 14 to the conductive feature 14. For the typical dual damascene interconnect used in copper metallization, the hole 16 is composed of a narrow lower via forming the vertical interconnect to the conductive feature 12 and a wide upper trench forming the horizontal interconnect between different portions of the integrated circuit. For dual damascene structures, the conductive feature 12 may be part of the copper-filled trench formed in the lower level dielectric 10. After the hole has been etched, a thin substantially conformal barrier layer, for example, of Ta/TaN is coated, typically by magnetron sputter onto the sides of the hole 16 as well as over the field area of the upper dielectric layer 14. A thin substantially conformal copper seed layer is then deposited over the barrier layer, typically also by magnetron sputtering. Thereafter, copper is electroplated into the hole 16 and over the field area. Finally, chemical mechanical polishing (CMP) is used to remove the copper outside the hole 16.

The photolithographic etching step, even after photoresist ashing, often leaves a carbonaceous or fluorocarbon polymeric layer 18 on the sides of the hole 16 which is advantageously used to achieve highly anisotropic etching but remains after cessation of etching. It also may leave an etching residue 20 at the bottom of the trench, which may be a combination of carbon, silicon and fluorine by-products of the etching chemistry. Further, the exposed copper in the conductive feature 12 is likely to have oxidized to copper oxide. Yet further, ashing residue 22 tends to form at the lip of the hole 16. Etching residues 20 and copper oxide at the bottom of the hole 16, if not removed prior to barrier deposition before the metallization deposition, increase the contact resistance. The polymeric coating 18 and the ashing residues 22 interfere with the bonding of the barrier layer to the dielectric layer 14 so that the barrier layer and copper via structure may delaminate during fabrication or during operation, resulting in a substantial reliability problem. It is thus greatly desired to remove the residues 18, 20, 22 and the copper oxide before the barrier deposition begins.

With conventional silica dielectrics, it has been common to dry clean the wafer between the etching and deposition steps by sputter etching the patterned wafer to remove the residue. Such sputter etching typically involves highly energetic ions, which do not greatly affect silica dielectric layers, which are relatively hard. However, low-k dielectric layers tend to be relatively soft. Therefore, a sputter etch tends to deleteriously etch and degrade the low-k dielectric layer. A softer chemical etching may be performed using a oxygen plasma generated in the cleaning chamber adjacent the wafer, that is, an in situ plasma. This cleaning process proved satisfactory for the early forms of low-k dielectric having a dielectric constant k of about 3.7 and not being porous. However, the in situ oxygen plasma has proved unsatisfactory for the most recent ultra low-k films having a k value of about 2.5 and a porosity of greater than 10%. It is believed that the oxygen plasma includes a high fraction of oxygen atoms which are attracted to the negative self-bias that develops on a floating body exposed to the plasma. The oxygen ions then strike the ultra low-k film with sufficient energy to damage it. Accordingly, the practice has developed of cleaning the patterned wafer with an oxygen plasma generated from a remote plasma source (RPS), as disclosed by Wood et al. in U.S. Patent Application Publication 2004/0219789. The remotely generated plasma emphasizes electrically neutral radicals, although ions may remain when the plasma reaches the processing space, while the in situ plasma emphasizes electrically charged ions generated in or near the processing space. The remotely generated oxygen plasma projects many neutral and low-energy oxygen radicals to the wafer, which oxidize and otherwise chemically react with the different residues to remove them However, excited oxygen has not proved satisfactory for the ultra low-k dielectric materials. The reduction in dielectric constant is often obtained by a high porosity in the dielectric material. Dielectric layers of BDII may have a porosity of over 10%, even above 30%. Therefore, they are not only very soft, they are also very reactive to an oxidizing dry cleaning. Furthermore, oxygen incorporated into the dielectric tends to produce a more polarizable bond than the silicon and carbon bonds, that is, to increase the dielectric constant. As a result, dry cleaning based on reducing chemistry has been developed using, for example, remotely generated plasmas of $NH_3$ (see U.S. Pat. No. 6,440,864 to Kropewnicki et al.) or relatively high pressures of $H_2$. The hydrogen approach has prevailed, but the results have still not been totally satisfactory. Even very small amounts of water vapor in the hydrogen plasma significantly reduce the hydrophobic property of the porous low-k film and thereby tends to increase the dielectric constant. Even a pure hydrogen plasma tends to degrade low-k materials. Further, reasonable etching rates have been achieved by increasing the chamber pressure, but the capacity of power supplies need to follow the increased pressure. Also, at the higher hydrogen pressures, the fraction of the hydrogen from the remote plasma source that is ionized and leaks into the cleaning chamber is increased. Hydrogen ions tend to be energetically attracted to the wafer and we believe they damage the porous low-k material.

I and others in U.S. patent application Ser. No. 11/334,803, filed Jan. 17, 2006, now published as U.S. Patent Application Publication 2007/0117397, and incorporated herein by reference, describe a process for pre-cleaning porous low-k dielectrics using a remotely generated plasma of either pure hydrogen gas or a mixture of hydrogen and helium gases. The plasma is generated in a remote plasma source and the ions are filtered from the source output so that only hydrogen radicals reach the wafer. The use of remotely generated radicals for chamber cleaning and an example of such a remote plasma source have been described by Chen et al. in "Advances in Remote Plasma Sources For Cleaning 300 mm and Flat Panel CVD Systems," *Semiconductor Magazine*, August 2003, 6 pp. Cleaning performance is improved by operating at a low partial pressure of hydrogen, for example, below 150 milliTorr and preferably 30 milliTorr for pure hydrogen. Although cleaning performance has been observed to be quite good, the expensive remote plasma source has exhibited a short lifetime before it fails. It is believed that the hydrogen plasma attacks and etches the alumina walls of the plasma source. Anodized aluminum walls like the chemically similar alumina walls are observed to degrade in a hydrogen plasma. Replacing the alumina walls with quartz walls would increase the lifetime to some degree. However, quartz-lined plasma sources even more expensive and quartz has been observed to also degrade in a hydrogen plasma. Similar etching effects have been observed in the alumina liner between the plasma source and the ion filter.

SUMMARY OF THE INVENTION

A plasma processing chamber is passivated with unexcited water vapor prior to the ignition of a plasma of a processing gas, for example, an etching or cleaning gas, especially one which is reducing such as hydrogen. The passivation is preferably performed for each cycle of substrate processing.

The invention is particularly useful for a plasma pre-cleaning chamber having a remote plasma source with dielectric walls in which hydrogen or a mixture of hydrogen and helium are remotely generated into a plasma, from which ions are filtered so as to provide an excited gas of hydrogen radicals. Such an cleaning process integrated with the water vapor passivation effectively cleans porous and soft low-k dielectrics.

A water vapor of about 1 Torr pressure downstream from a mass flow controller can be spontaneously generated from liquid water at room temperature and vacuum pumped to a pressure of 20 Torr or less. The same vapor source may be used to supply water vapor at much lower pressure, for example, a partial pressure of less than 1 milliTorr.

DETAILED DESCRIPTION OF THE PREFERRED EMBODIMENT

The hydrogen pre-cleaning process described in the cited patent application Ser. No. 11/334,803 advantageously dispenses with the water component of the cleaning plasma so as to avoid degradation of the dielectric constant of the porous low-k dielectric. However, it is now believed that the conventional plasma including water vapor provides some protection to alumina and other dielectric walls. The plasma pre-cleaning process of the cited patent application can be improved by passivating the remote plasma source and other walls facing the plasma with water vapor that has not been excited into a plasma, preferably, prior to ignition of the plasma containing hydrogen but no water.

Figure 2:
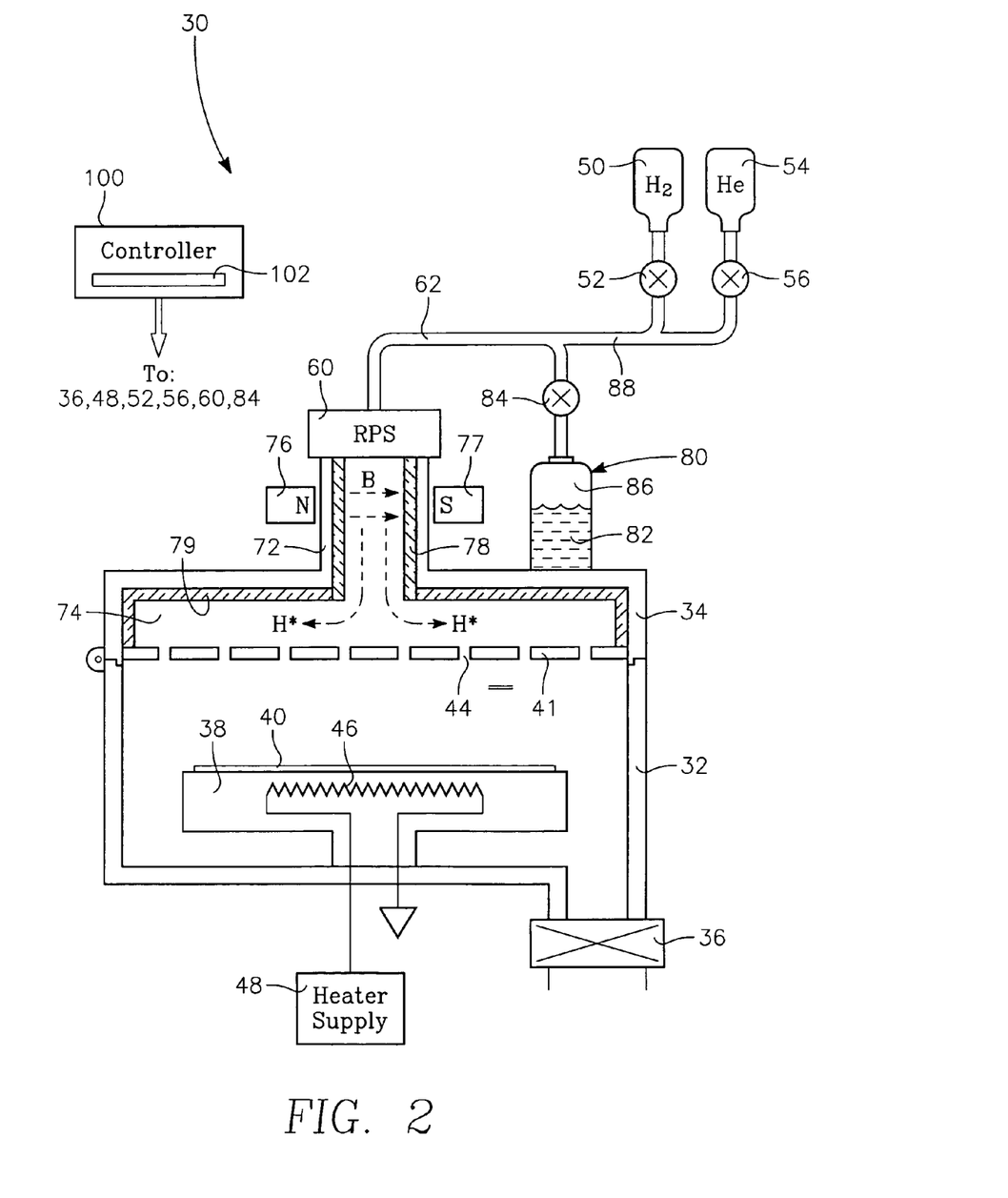
FIG. 2 is a cross-sectional view of a cleaning chamber using a remote plasma source and which is usable with the invention.

A remote plasma cleaning chamber 30 illustrated in the cross-sectional view of FIG. 2 includes a vacuum processing chamber 32 including an lid 34 which may be opened about a hinge and which is pumped by a vacuum pumping system 36. A pedestal 38 within the chamber 32 supports a wafer 40 to be cleaned in opposition to a gas showerhead 41 supplying a process gas through a large number of apertures 44. The pedestal 38 includes a resistive heater 46 selectively supplied with current from a heater power supply 48 to raise the temperature of the wafer 40 to a desired etching or pre-cleaning temperature.

Figure 3:
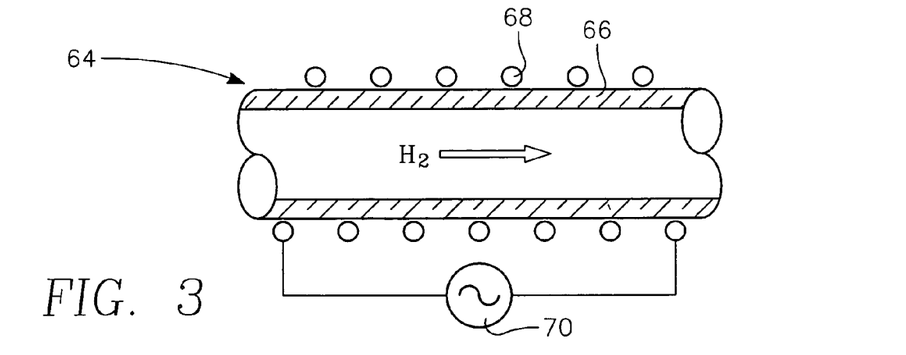
FIG. 3 is a schematic cross-sectional view of a remote plasma source.

The process gas for pre-cleaning is either pure hydrogen gas ($H_2$), which is selectively supplied from a hydrogen gas source 50 through a mass flow controller 52, or a combination of hydrogen and helium (He), which is selectively supplied from a helium gas source 54 through another mass flow controller 56. A single $H_2$/He gas supply of the desired helium fraction may be substituted. A remote plasma source (RPS) 60 mounted on the lid 34 receives the process gas from a supply line 62 and excites it into a plasma. The remote plasma source 60 may be of various types. An exemplary RF inductive remote plasma source 64 schematically illustrated in FIG. 3, includes a dielectric tube 66 around which an inductive coil 68 is wrapped. An RF power source 70 electrically powers the coil 68, which inductively couples RF energy into the bore of the tube 64 so as to excite gas flowing within the tube 66 into a plasma. In the present invention, hydrogen gas $H_2$ is excited into a plasma including charged hydrogen ions $H^+$ and neutral hydrogen radicals $H^*$. Advanced remote plasma sources tend to be more complex, for example, relying on toroidal excitation tubes, and other types of plasma generators are possible. The excited gas is delivered though an supply tube 72 to a gas manifold 74 in back of the showerhead 42.

Returning to FIG. 2, the remote plasma source is upstream of the vacuum chamber 32. An ion filter is disposed along the path between the remote plasma source 60 and the manifold 74 to remove any hydrogen ions $H^+$ so that only neutral hydrogen radicals $H^*$ reach the wafer 40. The ion filter may include two magnets 76, 77 disposed in opposition across the supply tube 72 to project a magnetic field B across the tube's interior to deflect or capture the charged hydrogen ions. A removable dielectric tube liner 78 may be placed inside the supply tube 72 and a dielectric chamber liner 79 may cover the walls of the manifold 74 to protect them and to reduce recombination of the hydrogen radicals. In one embodiment, the tube liner 78 is composed of alumina ($Al_2O_3$) and the manifold liner 79 and the showerhead 42 are composed of quartz ($SiO_2$). The excited gas is thus delivered uniformly through the showerhead 41 to the wafer 40 being cleaned.

In this embodiment of the invention, a vacuum-sealed ampoule 80 containing a pool 82 of liquid water is mounted on the chamber lid 34 and a mass flow controller 84 meters water vapor from the ampoule 80 into the remote plasma source 60. The vapor pressure of water at room temperature is about 20 Torr, which is well above the usual vacuum levels at which the remote plasma source 60 operates. Accordingly, once the ampoule 80 has been back pumped, a water vapor having a pressure of about 20 Torr exists in a head space 86 above the liquid water pool 82 in the ampoule 80. The ampoule 80 is mounted directly on the chamber lid 34 to minimize the length of tubing on the walls of which water vapor is likely to condense while the gas sources 50, 54 and their mass flow controllers 52, 56 are typically mounted on a remote gas panel with somewhat long tubing 88 to the chamber 30 and its remote plasma source 60. A single charge of liquid water has been observed to last for more than 100,000 wafer cycles consistent with the observation that the exemplary recipe of 5 sccm of water vapor for 8 seconds amounts to 0.66 cc of atmospheric pressure water vapor and thus about $0.54 \times 10^{-3}$ cc of liquid water. Nonetheless, a water level sensor is advantageously included with in the water ampoule 80.

Figure 4:
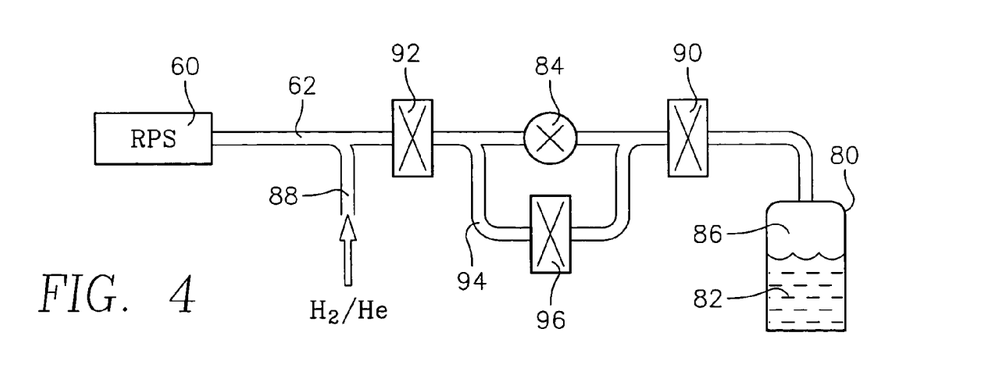
FIG. 4 is a more detailed piping diagram of the water vapor supply system.

A more complete embodiment of the water vapor supply system is schematically illustrated in FIG. 4. A first isolation valve 90 separates the mass flow controller 84 from the water ampoule 80 and a second isolation valve 92 separates the mass flow controller 84 from the supply line 62 to the remote plasma source 60. Additionally, a bypass line 94 around the mass flow controller 84 includes a third isolation valve 96. The isolation valves are useful for back pumping the water ampoule 80, isolating it during chamber maintenance, and for removing water condensate from the tubes.

As shown in FIG. 2, a computerized controller 100 receiving a recordable medium 102 controls the pumping system 36, the heater power supply 48, the remote plasma source 60, the gas mass flow controllers 52, 56, 84. The recordable medium 102, which may be a magnetic or optical disk such as a floppy disk or a CD, contains the process recipe according to which the controller 100 controls the sequence of operations in the passivation and pre-cleaning in the chamber 30 as well as the transfer of wafers into and out of the chamber 30 and the operation of the isolation valves 90, 92, 96 as required.

According to an aspect of the invention, a small amount water vapor is pulsed into the remote plasma source 60 and hence into the chamber 30 prior to the ignition of the plasma. The water vapor forms a thin water coating on all walls. After the water vapor injection stops and the chamber is pumped to the operational pressure in the sub-Torr range, the water coating largely evaporates. However, chemabsorption, especially to metal or to metal oxides such as alumina or to quartz, causes a very thin water layer to form on walls. Redhead in "Modeling the pump-down of a reversibly adsorbed phase. I. Monolayer and submonolayer initial coverage," *Journal of Vacuum Science and Technology A*, vol. 13 (2), 1995, pp. 467-475 discloses that at less 1 milliTorr of water vapor pressure the film is formed by a monolayer of water It is believed that O—H bonds form on the metal oxide or the native oxide of the metal. Haas et al. in "The chemistry of water on alumina surfaces: Reaction dynamics from first principles," *Science*, vol. 282 Oct. 9, 1998, pp. 265-268 discloses that water molecules form an O—H bond to the alumina surface. I believe that the O—H bond prevents ionic hydrogen from removing from the plasma-facing wall either oxygen or the metal, such as Al in alumina. Eventually, vacuum pumping desorbs and removes the water mono-layer. Our observation, however, is that if the water vapor passivation is performed every wafer cycle for a plurality of sequentially (serially) processed wafers or substrates, the protection lasts through the plasma stage of the process.

The same protection mechanism would apply if the plasma contains a water component as practiced in the prior art. However, water plasma deleteriously affects the low-k dielectric. Although the passivation with water vapor does deposit some water on the wafer, the pre-cleaning is usually performed with wafers recently inserted from a clean room ambient having 20 Torr of water vapor so that some water coating is inevitable and should be compared with the less 1 Torr of water vapor typically pulsed into the chamber during passivation. Furthermore, the standard pre-cleaning process heats the wafer to an excess of 300° C. If the heating starts only after the pulse of water vapor and if the plasma ignition is delayed for several seconds after heating has been completed, little water remains on the wafer in the presence of a plasma or hydrogen radicals.

Figure 5:
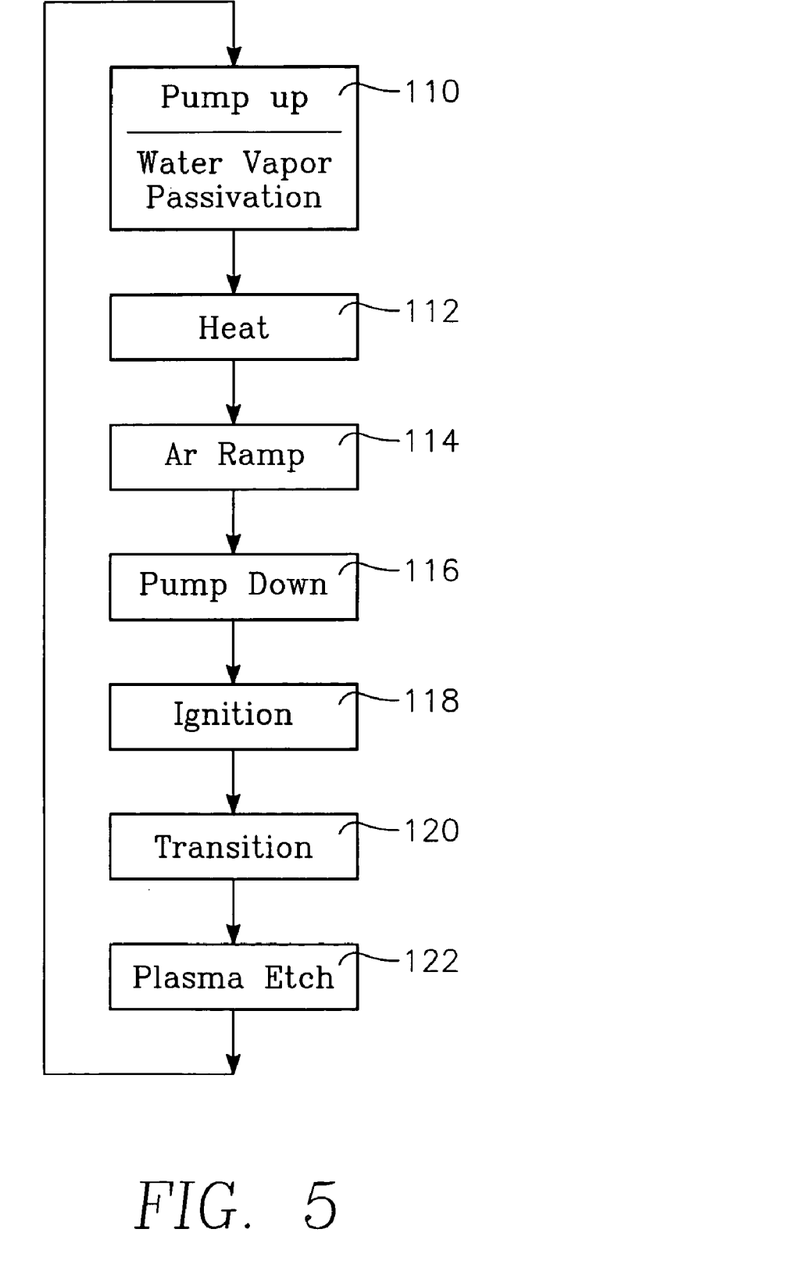
FIG. 5 is a process flow diagram for the water vapor passivation and remote hydrogen plasma clean.

A flow chart illustrated in FIG. 5 shows a plasma cleaning process performed for every wafer cycle. Although the invention can be practiced in multi-wafer batch chambers, the preferred cleaning process is performed in a single-wafer chamber, such as that illustrated in FIG. 2. In a pump up step 110, the chamber pressure is somewhat uncontrolled but generally is kept below 6.5 Torr. During part of this step 110, the slit valve separating the pre-clean chamber 30 from the central transfer chamber is opened to allow the robot blade to remove a wafer already pre-cleaned in the chamber and replace it with an unprocessed wafer. Preferably after the slit valve is closed large amounts of hydrogen and helium, for example, 2000 sccm apiece are flowed into the chamber to purge it. At the end of the pump up step 110, preferably after the slit valve has been closed, the water vapor passivation is performed. For example, 5 sccm of water vapor is flowed into the chamber for 8 seconds. Note that with the large amounts of hydrogen and helium, 1 Torr of chamber pressure amounts to a partial pressure of water vapor of about 1 milliTorr so that a partial pressure of water vapor of less than 10 milliTorr is clearly effective. The remote plasma source is not turned on so that neither the purge gas nor the water vapor is excited into a plasma and they flow through the remote plasma source into the chamber as unexcited gases.

In a heat step 112, the unprocessed wafer resting on the pedestal heats up to the temperature maintained in the pedestal during operation, for example, 250 to 350° C. The heater power supply is turned on to heat the pedestal to a predetermined temperature, for example, 350° C. During the heat step 112, the water vapor supply is discontinued and does is not resumed for the rest of the cycle of the process. The hydrogen flow continues but the helium supply is stopped. The chamber pressure is maintained at a relatively high 6.5 Torr to promote the heating and temperature equilibration of the chamber. In an argon ramp step 114 in preparation for plasma ignition, a significant amount of argon is supplied into the chamber, for example, 1000 sccm along with a continuing supply of a large amount of hydrogen. The chamber pressure remains high at 6.5 Torr. In a pump down step 116, the chamber pressure is reduced to 1 Torr in preparation of plasma ignition. The same amount of argon is supplied along with a small amount of hydrogen and optionally helium if the latter is used in the cleaning. In an ignition step 118, the RF supply to the remote plasma source is finally turned on to ignite the gas, now predominantly argon, into a plasma. In a transition step 120, the chamber is pumped down to the preferred chamber pressure for plasma pre-cleaning, the cleaning amounts of hydrogen and possibly helium are supplied, and the supply of argon is partially reduced.

Figure 6:
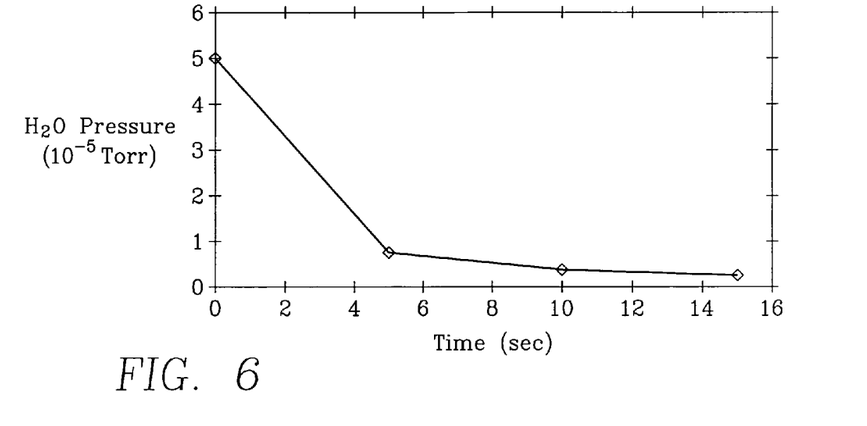
FIG. 6 is a timing diagram showing the decrease of water vapor partial pressure in the vacuum chamber after cessation of injecting water vapor.

By the time of the plasma ignition, only a monolayer of water is expected to coat the walls and wafer. As demonstrated by the chart of FIG. 6 illustrating the partial pressure of water vapor in the chamber after the cessation of injecting the water vapor, excess water vapor is quickly pumped out and the water vapor partial pressure is reduced to less than $3 \times 10^{-6}$ Torr. The very low water partial pressure assures minimum interference with the etching chemistry involved in cleaning the photoresist and other residues from the soft low-k dielectric. However, the temporary water monolayer remaining on the chamber wall seems to suffice to provide the plasma facing wall with protection against the hydrogen plasma.

Returning to FIG. 5, in a plasma etch step 122, the wafer is pre-cleaned by a plasma relying upon the reducing chemistry of hydrogen with the optional inclusion of helium. No argon is required to maintain the plasma. Two optimized pre-cleaning recipes have been developed. The first includes 30 s of etching in a 60 milliTorr chamber ambient supplied with only 400 sccm of hydrogen. The second includes 30 s of etching in a 350 milliTorr chamber ambient supplied with 400 sccm of hydrogen and 1200 sccm of helium. Other etching parameters may be developed. However, the water vapor passivation seems particularly useful when the etching plasma is a reducing chemistry, particularly a hydrogen radical chemistry, and including no significant water or oxidizing agent such as oxygen. The plasma etch step 122 completes the pre-cleaning of the wafer and the remote plasma source is turned off at the end of step 122. Operation then returns to step 110 for performing the same process on another wafer.

It should be apparent that many of the effects of the passivation could be obtained by supplying unexcited water vapor to the remote plasma source in the heat step 112 or possibly the argon ramp step 114 or pump down step 116 but prior to the ignition step 118. I have observed that, as long as an $H_2O$ has formed in the pump up step 110, continuing the flow in the following steps 112, 114, 116 has no significant effect.

Figure 7:
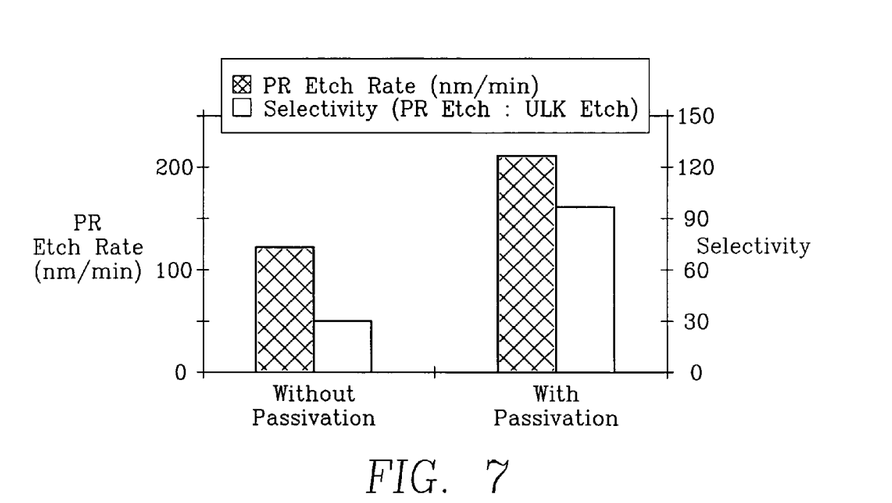
FIG. 7 is a bar chart showing the improvement of cleaning performance with use of water vapor passivation.

The water vapor passivation has been observed to increase performance of the pre-cleaning step. As illustrated in the bar chart of FIG. 7, the photoresist etch rate has been observed to increase from about 120 nm/min without passivation to about 200 nm/min with the water vapor passivation prior to ignition of the hydrogen plasma. Furthermore, the selectivity for the cleaning has been observed to increase from about 30 to above 90 where selectivity is defined as the ratio of the photoresist etch rate and the etch rate of the ultra low-k dielectric being cleaned.

The passivation also has been observed to lengthen the lifetime of the remote plasma source. Without passivation, the cleaning process completely shifts and the photoresist etch rate is reduced to less than 30% of its original value after the chamber has processed no more than 1800 wafers with a total of 900 minutes of operation of the remote plasma source. With water vapor process, the cleaning process shows no degradation for the number of wafers tested to date, specifically 10,000 wafers corresponding to 5000 minutes of operation of the remote plasma source.

In another sequential trial of processing wafers, without any passivation, the number of particle adders has been observed to grow to 200 adders over 0.12 µm per wafer. Thereafter, the trial was continued in the same chamber and remote plasma source. The number of adders immediately dropped to less than 30 and continued to drop to less than 10 within 20 additional wafers.

Water vapor is advantageously used with the invention because of its use already on similar chambers and its low cost and easy replacement. However, gases may be substituted for water which are have higher chemabsorption on wall surfaces, particularly alumina surfaces. Examples of such gases are $CH_4$, $CO$, and $CO_2$, which may be supplied from their own gas tanks, for example, mounted on the gas panel. These gases, when used for passivation, are not excited into a plasma but supplied through the remote plasma source or into the chamber in their unexcited gaseous forms.

The invention is particularly useful for prolonging the service life of a remote plasma source. However, it also serves to passivate the delivery tube, the showerhead, and other parts of the plasma reactor having walls, whether dielectric or metallic, exposed to a plasma or radicals derived therefrom.

Although the invention has been described with respect to passivation of a remote plasma source prior to ignition of pre-cleaning gas, the invention is not so limited. The remote plasma source may be used for the main ashing step removing the bulk of the photoresist. Also, chambers which are used for other types of plasma etching and more particularly etching using a reducing chemistry and whether using a remote or an in situ plasma may benefit from the use of the invention.

The invention is not limited to processing silicon wafers but may be used for processing other types of substrates such as glass and other dielectric panels.

For example, hydrogen atoms, whether as neutral radicals or charged ions, are useful in the chemical reduction of corrosion products on different types of substrates, including metals and non-metals. For example, metallic surfaces of historical and archeological artifacts can be cleaned with a beam of hydrogen atoms. The hydrogen atoms are often produced in plasma generators similar to the remote plasma sources used in the semiconductor industry. Similar hydrogen plasma generators are used as a source in hydrogen lasers. Heretofore, the equipment has been costly, due in part to the short lifetime of the plasma generator in the continuing presence of a hydrogen plasma. The invention can be easily applied to such hydrogen plasma generators by alternating supplying gaseous hydrogen to a powered or activated plasma generator and supplying water vapor to an unpowered plasma generator to temporarily passivate the plasma-facing walls of the plasma generator and the delivery system downstream. As shown by the data above, the passivation period may be substantially less than the plasma generation period so that the total cleaning throughput is not adversely affected. The output beam of the plasma generator may be directed at the substrate during both the cleaning and the passivation steps, but some applications may benefit if the water vapor is directed away from the substrate being processed or the end user of the hydrogen plasma.

The invention thus both improves the cleaning process and increases the lifetime of chamber parts and components with very little impact on throughput and the complexity and cost of the system and its operation.

The invention claimed is:

1. A passivation method for processing a semiconductor substrate having an exposed low-k dielectric layer having a dielectric constant of less than 3.7 in a plasma processing chamber in the formation of a semiconducting device, comprising the steps of:
   injecting a passivating gas comprising water vapor in a non-excited state into the processing chamber containing the substrate and maintaining it in the non-excited state, whereby the passivating gas passivates walls of the processing chamber in the non-excited state;

pumping the processing chamber after the end of the injecting step and before a plasma of a processing gas is excited, whereby the pumping removes the water vapor from the chamber; and then processing the semiconductor substrate in the processing chamber in the plasma of the processing gas different from the passivating gas.

2. The passivation method of claim 1, wherein the plasma is a reducing plasma.

3. The passivation method of claim 1, wherein the processing gas contains hydrogen.

4. The passivation method of claim 1, wherein the processing gas is chosen from the group consisting of (1) hydrogen and (2) hydrogen and helium.

5. The passivation method of claim 4, wherein the processing chamber includes a remote plasma source having an output tube connected to an interior of the processing chamber and the water vapor and processing gas are injected into the remote plasma source, wherein the remote plasma source is not activated sufficiently during the injecting step to excite the water vapor into a plasma but is activated sufficiently during the processing step to excite the processing gas into the plasma.

6. The passivation method of claim 5, wherein said processing chamber further includes a magnetic ion filter disposed and operating as a filter between the remote plasma source and the chamber through which the passivating gas and the processing gas flow and operating to remove ions and pass neutral particles.

7. The passivation method of claim 1, wherein the processing chamber includes a remote plasma source having an output connected to the interior of the processing chamber, wherein the water vapor and processing gas are injected into the remote plasma source, and wherein the remote plasma source is not sufficiently activated during the injecting step to excite the water vapor into a plasma but is sufficiently activated during the processing step to excite the processing gas into the plasma of claim 1.

8. The passivation method of claim 7, wherein the water vapor lengthens a lifetime of the remote plasma source.

9. The passivation method of claim 1, wherein the processing step cleans a dielectric layer in the semiconducting device.

10. The method of claim 1, wherein during the injecting step a partial pressure of the water vapor within the processing chamber is less than 10 milliTorr.

11. A plasma processing method, comprising the steps performed for each of a plurality of serially processed substrates of:

inserting a substrate into a plasma processing chamber including a pedestal for supporting the substrate, a gas showerhead opposed to the pedestal, and a remote plasma source having a supply tube connecting its output to a manifold in back of the showerhead;

passing water vapor through the remote plasma source and into the plasma processing chamber without exciting the water vapor into an effective plasma and maintaining the water vapor in an unexcited state in the plasma processing chamber;

pumping the processing chamber after the end of the passing step and before a plasma of a reducing processing gas is excited, whereby the pumping removes the water vapor from the chamber;

then passing the reducing processing gas though the remote plasma source and exciting it into the plasma and thereafter passing the reducing processing gas excited into the plasma into the plasma processing chamber; and then extinguishing the plasma and removing the substrate from the plasma processing chamber.

12. The method of claim 11, wherein the reducing processing gas comprises hydrogen and substantially no water vapor nor oxygen.

13. The method of claim 11, wherein the water vapor lengthens a lifetime of the remote plasma source.

14. The method of claim 11, wherein during the step of passing water vapor a partial pressure of the water vapor in the plasma processing chamber is less than 10 milliTorr.

15. A method for cleaning a semiconductor substrate having an exposed patterned low-k dielectric layer having a dielectric constant of less than 3.7 in a plasma processing chamber in the formation of a semiconducting device comprising the sequentially performed steps of:

injecting a passivating gas comprising water vapor but no hydrogen through a remote plasma source into the plasma processing chamber containing the substrate while the remote plasma source is not activated and maintaining the passivating gas in an inactivated state in the plasma processing chamber;

interrupting the injecting of the passivating gas while pumping the plasma processing chamber to thereby remove the water vapor; and then flowing an etching gas comprising hydrogen but no water vapor through the remote plasma source into the plasma processing chamber while the remote plasma source is activated to thereby clean the substrate with a plasma of the etching gas.

* * * * *